INVENTOR.
RONALD E. HARRIS

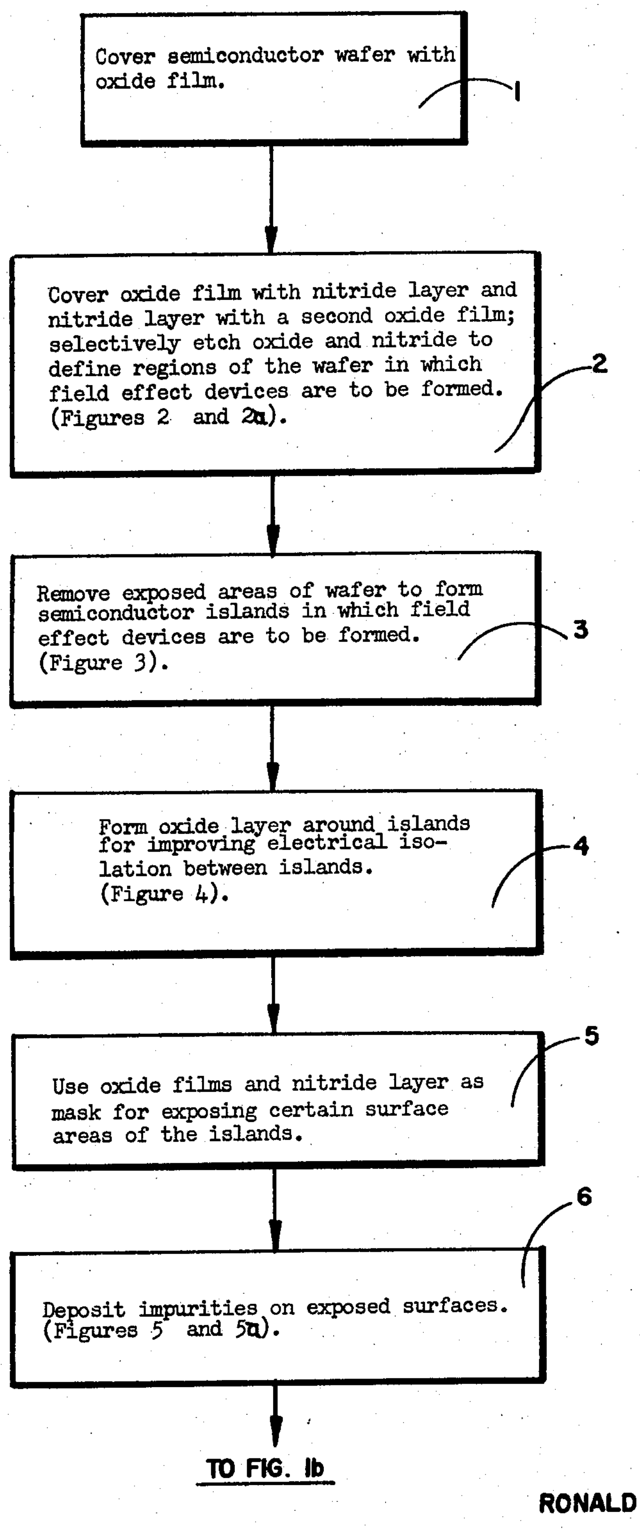
FIG. Ia
INVENTOR
RONALD E. HARRIS
BY Robert G. Rogers
ATTORNEY

BY Robert G. Rogers

ATTORNEY

Oct. 17, 1972 R. E. HARRIS 3,698,966

PROCESSES USING A MASKING LAYER FOR PRODUCING
FIELD EFFECT DEVICES HAVING OXIDE ISOLATION

Filed Feb. 26, 1970 6 Sheets-Sheet 3

INVENTOR.
RONALD E. HARRIS

BY Robert G. Rogers

ATTORNEY

INVENTOR.
RONALD E. HARRIS
BY Robert G. Rogers
ATTORNEY

INVENTOR.
RONALD E. HARRIS
BY Robert G. Rogers
ATTORNEY

*INVENTOR.*
RONALD E. HARRIS
BY Robert G. Rogers
ATTORNEY

United States Patent Office 3,698,966

Patented Oct. 17, 1972

3,698,966

PROCESSES USING A MASKING LAYER FOR PRODUCING FIELD EFFECT DEVICES HAVING OXIDE ISOLATION

Ronald E. Harris, Placentia, Calif., assignor to North American Rockwell Corporation Filed Feb. 26, 1970, Ser. No. 14,319

Int. Cl. H01l 7/44

U.S. Cl. 148—187 3 Claims

ABSTRACT OF THE DISCLOSURE

Oxide films and a nitride layer are selectively formed over the surface of a semiconductor wafer to define areas of the wafer in which field effect devices are to be formed. The nitride layer masks the inner oxide film as an oxide layer is formed around the masked regions to form laterally isolated semiconductor islands in which the field effect devices are to be formed.

Part of the nitride layer is then used to mask the oxide film defining the gate region of the field effect device. Conductivity regions are formed in the island by diffusion as nitride layers mask the contact regions of the field effect devices. Contacts are formed on the contact regions.

BACKGROUND OF THE INVENTION (1) Field of the invention

The invention relates to field effect devices and processes for forming field effect devices and, more particularly, to such devices and processes in which improved isolation is provided and in which a masking layer and oxide films are used for masking during the forming process.

(2) Description of prior art

Classes 29–578, 148–187, 317–(235–21.1) were searched in connection with the invention described herein. Pat. Nos. 3,102,230; 3,165,430; 3,183,129; 3,246,214; 3,287,243; 3,296,040; 3,312,879; 3,340,598; 3,373,051; 3,398,030; 3,412,397; 3,417,464; 3,419,761, 3,422,321; 3,431,636 were disclosed.

Pat. No. 3,296,040, Wigton, discloses the use of a silicon oxide mask for depositing a layer in the range of 1–3 microns thick.

Pat. No. 3,312,879, Godejahn, Jr., discloses the manufacture of a semiconductor device using a silicon nitride coating as an isolating material. The original wafer is oxidized, etched, and then coated with the silicon nitride.

Pat. No. 3,419,761, Pennebaker, discloses a method for using silicon nitride in the manufacture of an insulated gate FET.

Pat. No. 3,422,321, Tombs, discloses the use of oxygenated silicon nitride as a gate insulating layer.

Although the patents did teach and show semiconductor devices and processes for producing the devices using nitride layers and oxide films, the search did not disclose field effect devices fabricated by a process using a nitride layer for masking the thermal oxidation of the field and in which the nitride layer is used as an etch mask for a subjacent oxide film. The search also did not show the use of the nitride layer and oxide films in forming isolated islands in a semiconductor wafer. The search also did not disclose the other features of the invention as described more completely herein.

SUMMARY OF THE INVENTION

Oxide films and a sandwiched masking layer, such as a nitride layer, formed over the surface of a semiconductor wafer alternately mask each other for exposing surface regions of the wafer. The exposed surface regions are effectively removed and covered with an oxide layer for forming electrically isolated (laterally) semiconductor islands. On outer oxide film is formed over the nitride layer covering each island. The initially formed oxide film is subjacent the nitride layer.

In the preferred embodiment, the oxide films and nitride layer alternately mask each other. The oxide films and nitride layer of each island are removed for defining the gate region of a field effect device to be formed in the island. Impurities are diffused in the exposed island surface. A nitride layer, coated with an oxide film, is formed on part of the diffused region of each island to define metal contact regions of the field effect device.

The impurities are diffused into the island and laterally to the isolating oxide layer between islands. The impurities are not diffused into the host material under the oxide film defining the gate region.

The outer oxide film of each island is removed for exposing the nitride layers. The nitride layers are removed to expose the metal contact regions and the oxide film defining the gate region of the field effect device. Metal contacts are deposited over the exposed regions and on the gate oxide film for completing fabrication of the field effect devices.

Since the contacts are deposited on the surface of the island and on the relatively thin gate oxide films, the field effect device is substantially planar. The top surface of each island is substantially free of large steps, or variations, in thickness of the insulating films. In addition, because of the insulation between each island, relatively more devices can be fabricated in the wafer. Lateral diffusion is limited by the isolating layer around each island.

In the preferred embodiment, the oxide films and nitride layer are completely removed instead of interrupting the removal processes at a critical thickness. For example, if an etchant is used for removing the films and layer, the etching step goes to completion. In other processes, films are etched to a certain critical thickness and then regrown to the desired thickness required for dielectrical gate isolation. The present process requires the removal of only relatively thin oxide films instead of relatively thick oxide layers as is required in a number of existing processes.

Therefore, it is an object of this invention to provide a substantially planar field effect device formed in laterally isolated islands of a semi-conductor wafter in which the impurities forming different conductivity regions are diffused laterally to the isolating layer between the islands.

Another object of this invention is to provide a process for forming a substantially planar field effect device in isolation islands of a semi-conductor wafer in which impurities forming regions of a field effect device are diffused lateral to the isolating layer between the islands.

Still another object of this invention is to provide a substantially planar field effect device formed in isolated islands in which a self-aligning mask defines the position of the gate contact over the gate region.

Another object of this invention is to provide a process for forming semiconductor devices in isolated islands of a semiconductor wafer by using oxide films separated by a nitride layer for alternately masking each other in forming the islands and in producing diffused regions in the island separated by undiffused gate regions.

Another object of the invention is to provide a process using oxide films and a sandwiched nitride layer for symmetrically defining the gate regions of a field effect device between the diffused regions in isolated islands of a semiconductor wafer.

Still another object of this invention is to provide a process using oxide films and a sandwiched nitride layer for alternately masking each other during the process of forming isolated islands and during the process for forming metal contacts to diffused regions inside the isolated islands.

A further object of this invention is to provide a process in which thick oxide layers are formed over certain regions of a field effect device while only thin oxide films are required to be removed.

Another object of this invention is to provide a field effect device formed in isolated islands in which the top surfaces of the field effect device is free of relatively large oxide steps.

A still further object of this invention is to provide a process in which spreading the diffused regions by lateral diffusion is substantially reduced.

A further object of the invention is to provide a process for producing field effect devices in isolated islands of a semiconductor wafer using oxide films and a nitride layer for masking so that the number of photoetching steps can be reduced.

Still another object of the invention is to provide a process in which etching to a specific thickness of a film is not required.

A further object of the invention is to provide a process for producing a field effect device in isolated islands in which the capacitance of the diffused regions is lowered.

These and other objects of the invention will become more apparent when taken in connection with the description of the drawings, a brief description of which follows:

BRIEF DESCRIPTION OF DRAWINGS

FIGS. 1*a* and 1*b* comprise a block diagram of one embodiment of the process for making field effect devices in laterally isolated islands of a semiconductor wafer.

DESCRIPTION OF THE PREFERRED EMBODIMENT

For purposes of describing a preferred embodiment, an N-type silicon wafer is used. It should be understood that the process can also be used with other N- and P-type semiconductor materials which are equivalent to silicon. In addition, although P-type field effect devices are described as being produced by the process, the process can also be used to produce N-type and combinations of N- and P-type field effect devices. Since silicon is being used in the description, the oxide films are necessarily silicon dioxide ($SiO_2$) films. In the preferred embodiment, the nitride layers are described as silicon nitride ($Si_3N_4$) layers although alumina ($Al_2O_3$) may also be used.

Figure 1B:
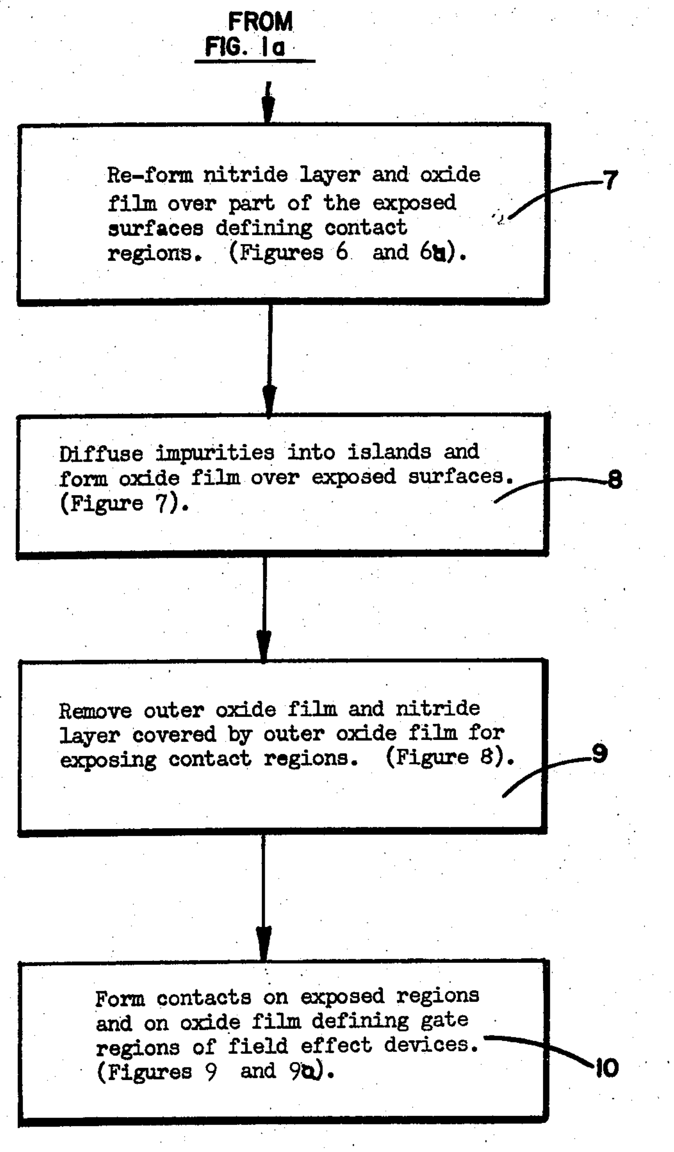

FIG. 1*a* illustrates Blocks 1–6 corresponding to Steps 1–6 of the process. In Step 1, a silicon semiconductor wafer is chemically etched to demove damaged surface areas and is then mechanically polished. It is then cleaned, for example, in an agitated solution comprising trichloroethylene, isopropyl alcohol, water and hydrofluoric acid.

The semiconductor wafer is oxidized to a thickness of, for example, 0.1 micron. The silicon dioxide film may be formed by subjecting the silicon wafer to oxygen and nitrogen streams in a furnace elevated to a temperature in excess of 1000° C.

In Step 2, the wafer is placed in, for example, an induction heated reactor for depositing a nitride layer on top of the silicon dioxide film. The nitride layer may be formed by bubbling nitrogen gas through silicon tetrachloride ($SiCl_4$). The silicon nitride layer may have a thickness relative to the doxide film of 0.2 micron. The nitride layer provides an oxidation mask for the oxygen film during the field oxidation.

A second silicon dioxide film is deposited on top of the nitride layer or, in the alternative, the silicon layer is oxidized to form the oxide film covering the nitride layer. The outer film, which may also have a thickness of approximately 0.1 micron, provides an etch mask for the silicon nitride during the subsequent process steps.

Figure 2:
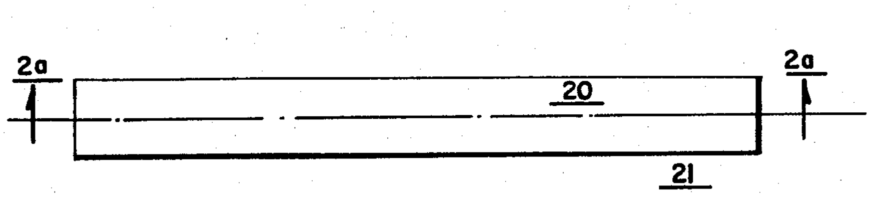
FIG. 2 is a top view of the semiconductor wafer showing oxide films and a sandwiched nitride layer masking the surface of the semiconductor wafer.
Figure 2A:
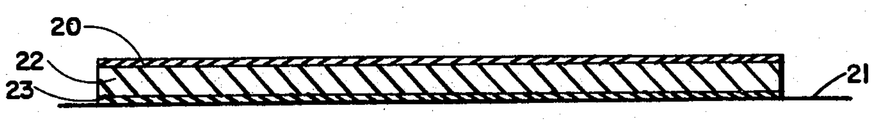
FIG. 2*a* is a cross-section taken along lines A—A of FIG. 2.

The outer silicon dioxide film is masked and the unmasked film is removed by an etchant such as ammonium fluoride and dilute HF. The exposed nitride is etched by, for example, phosphoric acid ($H_3PO_4$), for exposing the inner film which is also etched with ammonium fluoride and dilute HF. FIGS. 2 and 2*a* illustrate the wafer at the end of Step 2.

FIG. 2 is a top view of a portion of the silicon wafer showing the silicon doxide film 20 and the exposed silicon surface 21. FIG. 2*a* shows the relative position of the silicon dioxide film 20, the silicon nitride layer 22 and the inner silicon dioxide film 23 which is subjacent the silicon nitride layer 22. The relationship between the exposed silicon surface 21 and the masked silicon wafer 22 is also more clearly illustrated.

Figure 4:
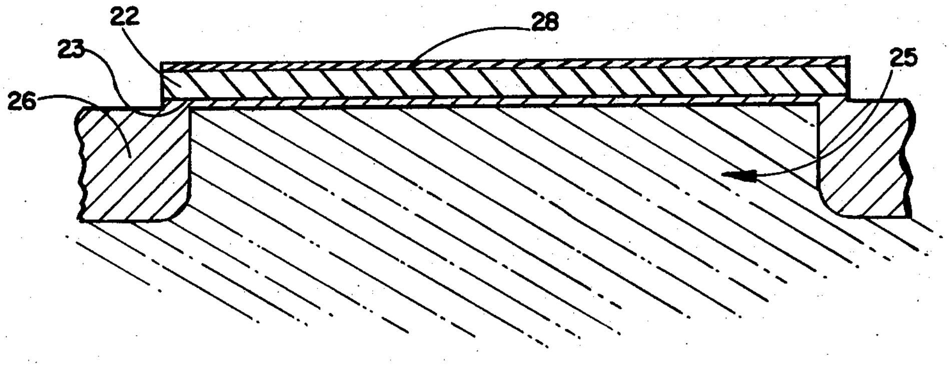
FIG. 4 is a side view of the semiconductor wafer after an oxide film has been formed in the removed areas for improving the lateral isolation between adjacent islands.

In Step 3, the exposed wafer surface 21 is etched, for example by a solution comprising acetic acid, nitric acid and hydrofluoric acid, to a depth of approximately one micron for forming islands in the silicon wafer surface. The semiconductor wafer is etched to a depth of approximately one-half of the desired field oxide thickness as shown in FIG. 4. During the etching step, the outer silicon dioxide film 20 (see FIG. 2*a*) was removed leaving the silicon nitride layer 22 as a mask for the inner silicon dioxide film 23.

Figure 3:
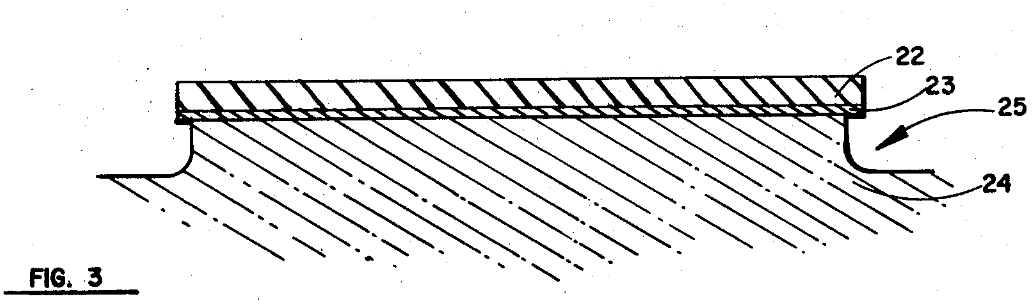
FIG. 3 is a side view of the semiconductor wafer after the unmasked areas have been removed to form semiconductor islands.

FIG. 3 is a cross-sectional view taken along lines A—A of FIG. 2 showing island 25 comprising the N-type silicon semiconductor material 24 shown masked in FIG. 2*a*. Although only one island is shown, it should be understood that a plurality of such islands are formed simultaneously.

In Step 4, a silicon dioxide layer is thermally grown in the etched field areas surrounding the silicon islands. The silicon nitride layer is used as an oxidation mask during Step 4 to prevent the inner silicon dioxide film 23 from increasing in thickness as the oxide layer is formed in the etched areas. As the oxide layer is formed, silicon material is used so that the height of the islands, for example, 2 microns, is increased relative to the depth of the silicon regions surrounding the islands. The field oxide is grown on a level with the top of the island. It is pointed out that the islands were defined by etching a relatively thin (0.1 micron) oxide film.

FIG. 4 illustrates a cross sectional view of island 25 also taken along lines A—A of FIG. 2. The silicon dioxide layer 26 is on a level with the top of island 25. During the process of thermally growing the field oxide layer 26, an outer oxide film 28 is also formed. The height of the island 25 is approximately twice the height of the island shown in FIG. 3.

As an alternate to etching the silicon wafer and then thermally growing an oxide layer in the field region surrounding the islands, the nitride layer 22 could be used to mask the oxide film 23 while the exposed silicon wafer is oxidized to form the layer 26. In other words, the etching step could be eliminated by oxidizing the silicon wafer to the required depth as shown in FIG. 4.

In Step 5, the outer $SiO_2$ film is masked and the unmasked film is etched to expose the nitride layer 22. The exposed nitride layer is then etched to the inner $SiO_2$ film 23. Thereafter, the inner film 23 and the outer film 28, previously masking the nitride layer 22, are etched. The unetched nitride layer and $SiO_2$ film 23 provide a mask for a gate region of a field effect device.

In Step 6, boron is deposited on the exposed surfaces of each island. The boron is a $p^+$ material used in forming different conductivity regions in the N-type silicon island.

Figure 5:
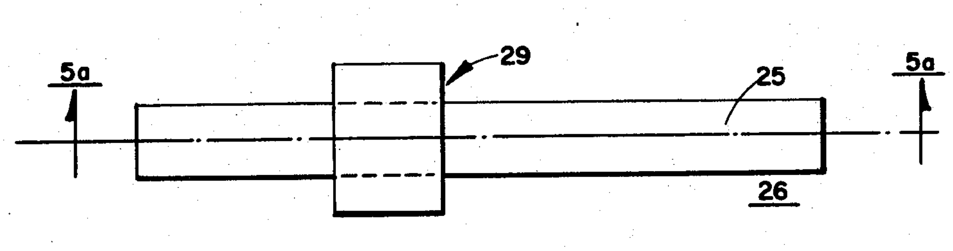
FIG. 5 is a top view of the semiconductor wafer showing a nitride layer and a subjacent oxide layer defining the gate contact region of a field effect device.
Figure 5A:
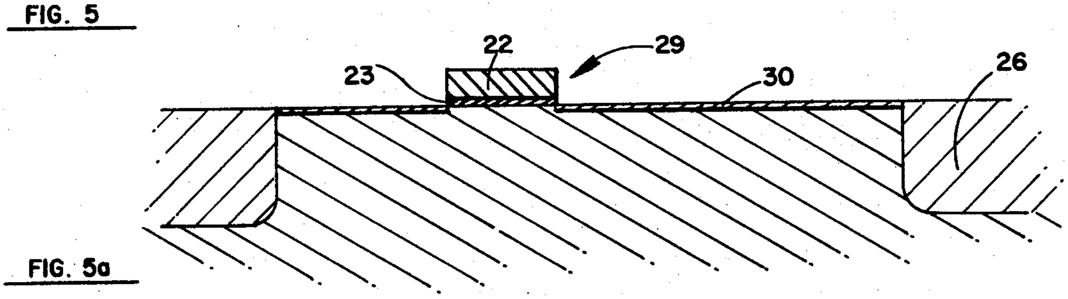
FIG. 5*a* is a side view of FIG. 5 taken along lines A—A.

FIGS. 5 and *5a* illustrate one part of the semiconductor wafer after Step 6. FIG. 5 shows the gate mask 29 of island 25. The $SiO_2$ layer 26 surrounds the island 25.

FIG. *5a* is a side view of the island 25 taken along lines A—A showing oxide layer 26 surrounding the island 25. Boron layer 30 is shown deposited on the surface of the island around the gate mask 29 which comprises silicon nitride layer 22 and silicon dioxide layer 23.

The outer oxide film 28 masked the nitride layer 22 over the gate region while the unmasked nitride layer was etched to the inner $SiO_2$ film 23. The nitride layer 22 then masked the gate oxide film 23 while the exposed oxide film was etched away to expose the surface of island 25.

In Step 7, the top surface of the islands are masked and silicon nitride deposited in locations defining contacts of field effect devices to be formed. A silicon dioxide film is then formed over the tops of the deposited nitride layers.

Figure 6:
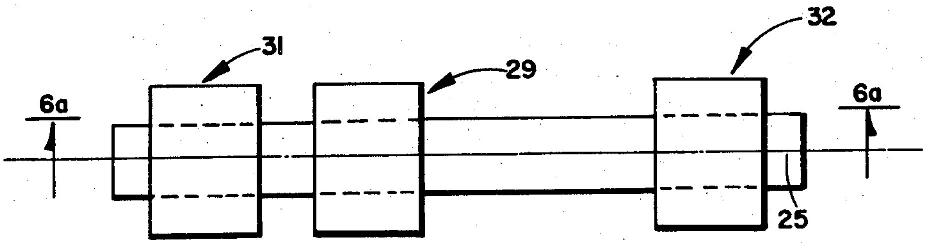
FIG. 6 is a top view of the semiconductor wafer showing a nitride layer covered by an oxide film for defining contact regions of the field effect device.
Figure 6A:
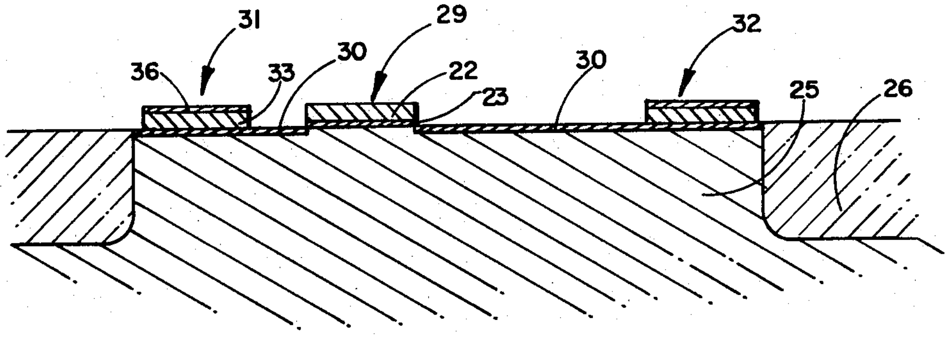
FIG. 6*a* is a side view of FIG. 6 taken along lines A—A.

FIG. 6 illustrates the top of a portion of the silicon wafer showing island 25 and the deposited contact masks 31 and 32 each comprising an outer film of silicon dioxide and an inner layer of silicon nitride. The gate mask 29 is shown between the other contact mask. The gate mask comprises an outer layer of silicon nitride and an inner silicon dioxide film.

FIG. *6a*, taken along lines *6a—6a* of FIG. 6, illustrates the relationship of the contact masks more clearly. Gate mask 29 is shown between the contact masks 31 and 32 on the island 25. The island is shown surrounded by silicon dioxide layer 26 for improving the electrical isolation between the islands of the semiconductor wafer.

As indicated above, the gate mask 29 comprises outer silicon nitride layer 22 and inner silicon dioxide film 23. The order is reversed for the contact masks. The silicon nitride layer 33 for mask 31 is formed on top of the deposited boron 30, and silicon dioxide film 34 is formed on top of silicon nitride layer 33. Contact mask 32 also has a silicon nitride layer 35 formed on top of the deposited boron layer 30. Silicon dioxide film 36 is formed on top of the nitride layer. The silicon dioxide film may be formed by oxidizing the silicon nitride or by depositing the $SiO_2$ film on top of the silicon nitride.

In Step 8, the silicon wafer is inserted into a furnace for diffusing the deposited boron into the island semiconductor material. The boron previously deposited in Step 6 is diffused into the island semiconductor material.

Figure 7:
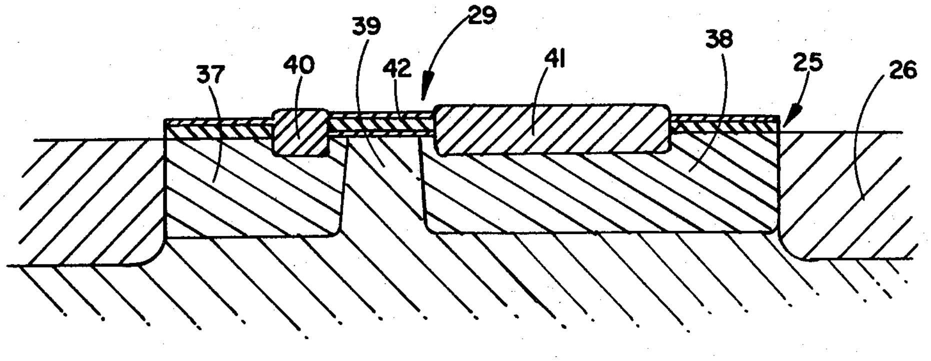
FIG. 7 is a side view of the wafer showing the diffused regions separated by the gate region.

FIG. 7 is a cross-section of island 25 showing the regions 37 and 38 produced by diffusing boron into the N-type silicon. The diffused regions have a $p^+$ concentration. FIG. 7 also illustrates how the spreading of the p-regions by lateral diffusion is stopped. The boron only diffuses laterally to the oxide layer 26 around the island.

In addition, gate mask 29 is shown symmetrically located over the gate region 39. The lateral diffusion of the boron into the island is uniform so that the mask 29 is symmetrically aligned over the gate region 39.

During the diffusion process, silicon dioxide layers 40 and 41 are formed over the exposed portions of the island 25. A silicon dioxide film 42 also forms over the silicon nitride layer 22 of the gate mask. Although not shown, the silicon dioxide layers 34 and 36 of the other contact masks 31 and 32 may also be slightly increased in thickness.

In Step 9, the outer silicon dioxide films are removed, for example, by a hydrofluoric etchant. After the silicon dioxide has been removed, the silicon nitride layers defining the various contact regions for the field effect devices are exposed. The silicon nitride layers are then etched, for example, by a phosphoric acid etchant ($H_3PO_4 \cdot H_2O$). The nitride etch exposes the island surfaces and the silicon dioxide film 23 upon which metal contacts are to be formed.

Figure 8:
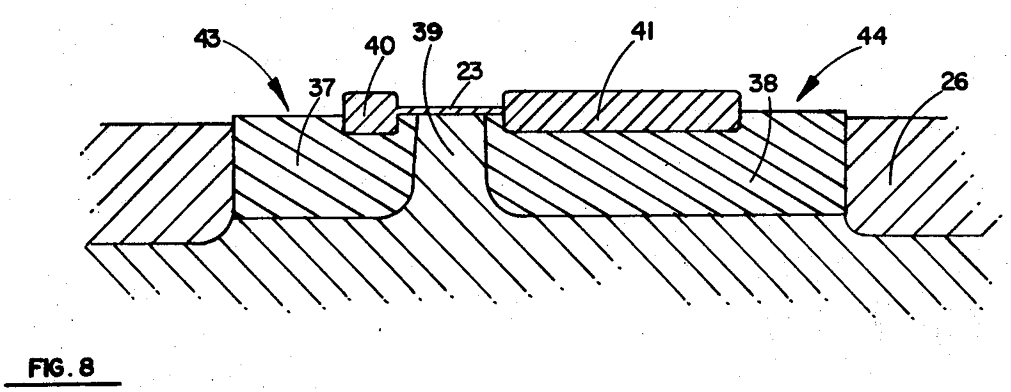
FIG. 8 is a side view of the semiconductor wafer showing the P-regions separated by a gate region after the masking nitride layers have been removed for exposing the surface in the gate isolation film.

FIG. 8 is a cross-section of the island after the silicon nitride layers have been removed. Contact regions 43 and 44 are exposed for metal contacts to be applied directly to the $p^+$ regions 37 and 38, respectively. It is pointed out that the nitride layers were not required to be etched to a specific thickness. The layers, as were other etched layers described herein, were etched to completion.

The silicon dioxide layer 23 comprising the gate insulating layer was masked by silicon nitride layer 22 which was removed by the phosphoric acid etchant. Silicon dioxide layers 40 and 41 remain in place over the top of the island.

In Step 9, metal is deposited over the wafer surface by, for example, electron beam evaporation. The metal may be aluminum or other suitable conducting metals. After the metal has been deposited over the wafer surface, a photoresist mask is applied to define the contact areas and the conductors connected to the contacts. The unmasked metal layers are then etched, and the photoresist removed. The wafer is then processed according to known techniques to complete the fabrication of the field effect devices.

Figure 9:
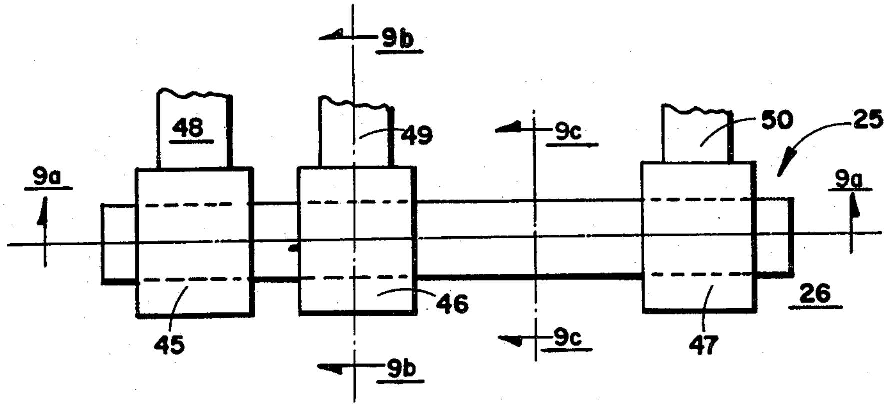
FIG. 9 is a top view of the semiconductor wafer showing the metal contacts over the regions of the field effect device.
Figure 9A:
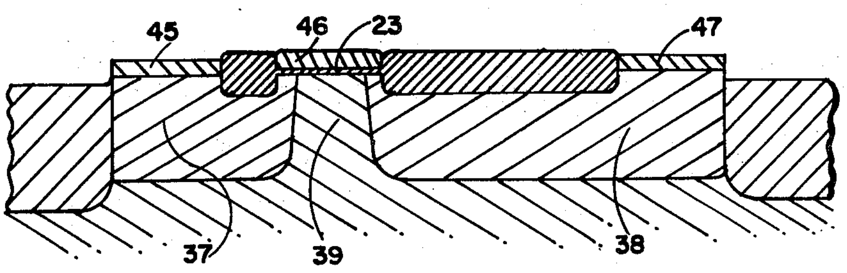
FIG. 9*a* is a cross-section of FIG. 9 taken along lines A—A.
Figure 9B:
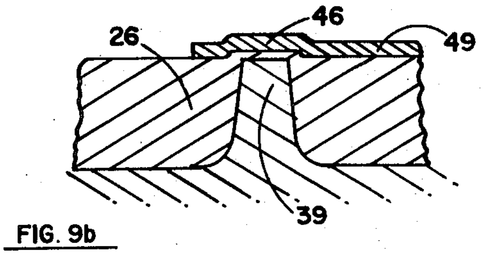
FIG. 9*b* is a cross-section of FIG. 9 taken along lines B—B.
Figure 9C:
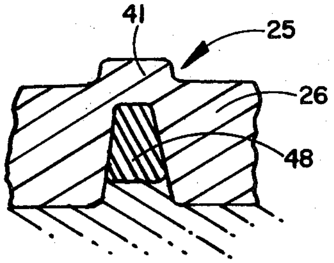
FIG. 9*c* is a cross-section of FIG. 9 taken along lines C—C.

FIG. 9 is a top view of the semiconductor wafer showing island 25 surrounded by silicon dioxide layer 26. Contacts 45, 46 and 47 for the various regions of the field effect devices are also shown. Conductors 48, 49 and 50 are shown connected to the contacts.

FIG. *9a* is cross-section of FIG. 9 taken along line *9a—9a*, showing contact 45 on top of $p^+$ region 37 and contact 47 on top of $p^+$ region 38. The gate contact 46 is shown on top of gate insulating silicon dioxide layer 23 which is deposited over gate region 39.

As can be seen by FIG. *9a*, the top surface of the structure is substantially planar. In other words, it is free of relatively large oxide steps. The only deviation from a planar surface is the relatively slight difference in height of the gate contact from the source and drain contacts.

FIG. *9b* is a cross-sectional view of FIG. 9 taken along *9b—9b* showing the island 25. Gate electrode 46 as well as conductor 49 are shown in position over the gate region 39. Silicon dioxide layer 26 surrounding the island is also shown.

FIG. *9c* is a cross-sectional view of the island 25 taken along lines *9c—9c* of FIG. 9. The $p^+$ region 48 covered by silicon dioxide layer 41 is shown surrounded by silicon dioxide layer 26.

As indicated by the above process, only four photo etching steps are required. Although thick oxides are grown over the areas between the islands and over the $p^+$ regions, only thin silicon dioxide layers are required to be etched by the process.

It should also be pointed out that by leaving the silicon dioxide film 23 in place during the process, the gate region is automatically aligned under the gate contact 46. In some instances, it is possible that the gate contact be misaligned relative to the gate region. As a result, the gate contacts may not exert the control required.

Since the silicon dioxide layer 26 extends between the islands, the $p^+$ region capacitance is lowered. The use of a self-aligning mask for the gate and the use of the island structure for lowering the $p^+$ region capacitance permits relatively faster circuits to be designed and fabricated. The advantage of stopping the spreading of lateral diffusion, producing a planar surface, and etching only thin oxide films, enables the fabrication of higher circuit densities in a semiconductor wafer.

EXAMPLE

An N-type monocrystalline silicon wafer, with a clean, damage-free surface, was heated in a resistance heated furnace to approximately 1100° C. for 60 minutes. A silicon dioxide film having a thickness of 0.14μ was formed by flowing oxygen over the wafer. A silicon nitride layer of approximately 1000 A. thickness was then deposited on the silicon dioxide film by reacting ammonia with silane ($NH_3$:$SiH_4$) over the wafer. The wafer was heated to approximately 900° C. for three and one half minutes in a hydrogen ambient.

A second silicon dioxide film was deposited by heating the wafer to approximately 300° C. for five minutes and flowing silane and oxygen ($O_2$:$SiH_4$) across the wafer. The silicon dioxide film had a thickness of approximately 5000 A.

In the next step, the outer silicon dioxide film was masked and the unmasked silicon dioxide film was etched away using ammonium fluoride ($NH_4F$:HF). The silicon nitride layer was then etched with boiling phosphoric acid at a temperature of approximately 175° C. The silicon dioxide film on the surface of the wafer was also etched to expose the surface of the silicon wafer.

In the next step, the field, or area surrounding the masked regions, was etched to a depth of approximately one micron using an etchant comprising $$5HNO_3:5HA_c5H_3PO:_4HF$$

Silicon islands were formed in the wafer surface by etching the field area.

The field region around the silicon islands was then oxidized to a depth of approximately 1.7 microns using steam. The wafer was maintained at a temperature of approximately 1200° C. for three and one half hours during the oxidizing step.

A gate mask wasapplied to the silicon dioxide-nitride layers on the semiconductor islands and the unmasked portion etched to expose regions of the island surfaces. Boron was then deposited on the exposed surfaces with the wafer maintained at approximately 1000° C. for 20 minutes. Argon was bubbled through boron tribromide and added to oxygen in nitrogen to achieve the desired boron deposition ambient.

Silicon nitride was deposited on certain areas of the region for defining metal contact regions. A silicon dioxide layer was then formed over the nitride layers.

The previously deposited boron was diffused into the island areas using steam to form P-regions under the metal contact masks. The wafer was maintained at a temperature of 1050° C. for approximately 90 minutes during the diffusion. During the process, a silicon dioxide layer of approximately 0.8 micron was formed on the island surface between the contact masks.

In the next step, the silicon dioxide film on top of the contact masks was removed and the silicon nitride layers were etched with a phosphoric acid etchant. The nitride layers (previously masked and last deposited) were etched to the island surface and to the silicon dioxide film of the gate areas. The silicon dioxide film masked the gate region so that the boron was not diffused into the gate region. As a result, the gate region remains symmetrically located between diffused P-regions. In addition, the gate $SiO_2$ film was masked during the diffusion step on the nitride layer so that the thickness remained the same (0.14 micron).

Aluminum was then deposited on the exposed contact regions by an electron beam process. The metal had a thickness of approximately 1.0 micron.

The metal was masked and the aluminum etched from the island surface leaving the contact regions. An etchant comprising $H_3PO_4$,$HA_c$, $HNO_3$, and water maintained at a temperature of approximately 60° C. was used.

A number of semiconductor devices can be produced by using the oxide/nitride isolation process described herein. For example, a CMOS device on silicon can be advantageously produced. With oxide isolation at the sides of the diffused regions, the $p^-$ areas need to be no larger than the $n^+$ source and drain regions, thereby removing a serious size penalty. This approach also substantially reduces capacitance from the $n^+$ drains to the $p^-$ region. Some other devices that can be produced with the processes described herein include planar bipolar transistors. Oxide isolation of the emitter periphery from the base of the transistors results in higher $BV_{EBO}$ and lower emitter-base capacitance with less surface domination of current gain.

Junction field effect transistors can also be improved by the proces. The oxide isolation on the transistors decreases gate capacitance and increases the gate breakdown voltage. The devices can be fabricated on thin films of silicon-on-sapphire with additional advantages.

Lateral transistors can also be produced by the process. One of the primary difficulties in fabricating a lateral transistor in bulk or thin film silicon is obtaining a low-resistance contact to a narrow base. The process described herein permits the low-resistance contact to be obtained.

In addition, bipolar integrated circuits can advantageously be produced using the oxide/nitride isolation process. The circuits can be built at much higher component densities and with reduced parasitic capacitance by using oxide isolation to make narrower diffused resistors with smaller area contacts. The above examples are not intended to be exhaustive of the devices which can be produced with the process. Other equivalent devices can also be produced advantageously with improved techniques.

I claim:

1. A process for producing semiconductor devices in a semiconductor wafer comprising the steps of:

forming a first oxide film on the surface of said semiconductor wafer, forming a first nitrile film over said first oxide film, forming a second oxide film over said nitride film, first masking and etching said second oxide film for exposing selected regions of said nitride film, first etching the exposed regions of said nitride film to expose said first oxide film, etching the exposed regions of said first oxide film for exposing the selected areas of said semiconductor wafer, the remaining area being covered by the unetched portion of said first oxide film and said first nitride film, forming an oxide layer around the covered portions of said semiconductor wafer for forming electrically insulated mesas, second masking and etching said first nitride film to expose selected regions of said first oxide film, second etching the exposed regions of said first oxide film for exposing the underlying surface of said mesa, depositing a conductivity type of impurity on the exposed mesa surface, forming a second nitride film on said deposited impurity, said film being coated by a third oxide film masking selected regions of said mesa on which contacts of a semiconductor device are to be formed, and diffusing said conductivity type impurity into said mesa for forming regions of different conductivity in the mesa, said diffusing step continuing until said conductivity is diffused to the oxide layer surrounding said mesa, said conductivity type impurity also being diffused symmetrically under the unetched region of said first oxide film covered by said first nitride film, said first oxide film being masked by said first nitride film during the diffusing step whereby the thickness of said first oxide film is not increased during said diffusing step.

2. The process recited in claim 1 further including the steps of:

etching said nitride films from said mesa, the etching of said second nitride film exposing the surface of said semiconductor mesa, and the etching of said first nitride film exposing the unetched region of said first oxide film on the surface of said mesa, forming contacts on the exposed surface of said mesa and on said first oxide film for forming a semiconductor device.

3. The process recited in claim 2 wherein said semiconductor device is a field effect transistor, said contact on said first oxide film comprising the gate electrode of said field effect transistor and the contacts on the exposed surface regions of said mesa comprising the source and drain electrodes of said field effect transistor, said gate electrode being symmetrically disposed over the gate region of said field effect transistor comprising the portion of said mesa underlying said first oxide film, said portion being the portion into which said conductivity type impurity was not diffused during said diffusing step.

References Cited

UNITED STATES PATENTS

| | | | |
|---|---|---|---|
| 3,184,823 | 5/1965 | Little | 148—187 |
| 3,404,451 | 10/1968 | So | Dual Diel. |
| 3,426,422 | 2/1969 | Deal. | |
| 3,438,873 | 4/1969 | Schmidt. | |
| 3,466,741 | 9/1969 | Wiesner. | |
| 3,474,310 | 10/1969 | Ono | 148—1 |
| 3,477,886 | 11/1969 | Ehlenberger | Dual Diel. |
| 3,484,313 | 12/1969 | Tauchi. | |

HYLAND BIZOT, Primary Examiner